United States Patent [19]

Nakagawa et al.

[11] Patent Number: 5,071,671

[45] Date of Patent: * Dec. 10, 1991

[54] PROCESS FOR FORMING PATTERN FILMS

[75] Inventors: Yoshitomo Nakagawa; Takashi Kaito; Hisao Houjyo; Masahiro Yamamoto, all of Tokyo, Japan

[73] Assignee: Seiko Instruments Inc., Japan

[*] Notice: The portion of the term of this patent subsequent to Oct. 17, 2006 has been disclaimed.

[21] Appl. No.: 426,430

[22] Filed: Oct. 24, 1989

Related U.S. Application Data

[63] Continuation of Ser. No. 921,820, Oct. 17, 1986, Pat. No. 4,874,632, which is a continuation of Ser. No. 706,478, Feb. 28, 1985, abandoned.

[30] Foreign Application Priority Data

Feb. 28, 1984 [JP]  Japan ................... 59-38131

[51] Int. Cl.$^5$ ............................................. B05D 3/06
[52] U.S. Cl. ..................................... 427/41; 427/431;
427/44; 427/82; 427/227; 427/249; 427/250;
427/255.6; 437/225
[58] Field of Search ..................... 427/43.1, 255.6, 249,
427/41, 44, 250, 140, 82, 227; 430/290, 326,
327, 331, 328; 428/63, 138

[56] References Cited

U.S. PATENT DOCUMENTS

| | | | |
|---|---|---|---|
| 3,117,022 | 1/1964 | Bronson | 117/212 |
| 3,364,087 | 1/1968 | Solomon | 156/4 |
| 3,516,855 | 6/1970 | Goll | 117/212 |
| 3,547,683 | 12/1970 | Williams et al. | 427/255.6 |
| 3,801,366 | 4/1974 | Lemelson | 117/212 |
| 3,930,155 | 12/1975 | Kanomata et al. | 250/309 |
| 3,949,106 | 4/1976 | Araki et al. | 427/249 |
| 4,042,006 | 8/1977 | Engl | 164/46 |
| 4,357,364 | 11/1982 | Jones | 427/43.1 |
| 4,405,435 | 9/1983 | Tateishi | 204/298 |
| 4,460,436 | 7/1984 | Hiraoka | 156/643 |
| 4,488,506 | 12/1984 | Heinecke | 118/667 |
| 4,609,566 | 9/1986 | Hongo | 427/53.1 |
| 4,609,809 | 9/1986 | Yamaguchi | 219/121 EM |
| 4,698,236 | 10/1987 | Kellogg | 427/43.1 |
| 4,874,632 | 10/1989 | Nakagama et al. | 427/41 |

FOREIGN PATENT DOCUMENTS

| | | |
|---|---|---|
| 0130398 | 1/1985 | European Pat. Off. . |
| 49-97690 | 9/1974 | Japan . |
| 53-135276 | 11/1978 | Japan . |
| 58-6133 | 1/1983 | Japan . |
| 60-46372 | 3/1985 | Japan . |
| 60-94728 | 5/1985 | Japan . |
| 2039500 | 8/1980 | United Kingdom . |

OTHER PUBLICATIONS

"The 45th Extended Abstracts; The Japanese Society of Applied Physics, Carbonized Film Pattern Formed by Focused Ion Beam CVD", Oct., 1984.

Japanese Journal of Applied Physics, vol. 23, No. 5, May, 1984, pp. L293-L295, article, "Ion Beam Assisted Deposition of Metal Organic Films Using Focused Ion Beam", by K. Gamo et al.

Nuclear Instruments and Methods, vol. 182/183 (1981), pp. 297–302, article, "Carbon Buildup by Ion-Induced Polymerization Under 100–400 keV H,He and Li Bombardment", by W. Moller et al.

Extended Abstracts of the 16th Conference on Solid State Devices and Materials, Kobe, 1984, pp. 31–34 by K. Gamo et al., "Characteristics of Selective Deposition of Metal Organic Films Using Focused Ion Beams".

Primary Examiner—Shrive Beck
Assistant Examiner—Alain Bashore
Attorney, Agent, or Firm—Bruce L. Adams; Van C. Wilks

[57] ABSTRACT

A focused ion beam is irradiated on a predetermined area of a substrate on which a film is to be formed, and a vapor stream of film-forming depositable material is directed onto a localized area of the substrate which is being irradiated with the focused ion beam to convert the film-forming material to a film deposit on the predetermined area of the substrate. The process can be used to repair white-spot defects in masks and to otherwise deposit films having sharply defined edges and widths in the submicron range.

23 Claims, 2 Drawing Sheets

PROCESS FOR FORMING PATTERN FILMS

RELATED APPLICATION

This application is a continuation of application Ser. No. 921,820 filed Oct. 17, 1986 now U.S. Pat. No. 4,874,632 which is a continuation of application Ser. No. 706,478 filed Feb. 28, 1985, now abandoned.

BACKGROUND OF THE INVENTION

This invention relates to a process for forming a pattern film for use, for example, in correcting or repairing a photomask during the fabrication of semiconductor devices.

Masks and reticules for use in the manufacture of semiconductors are made by etching patterns by exposure to light. The process presents problems because of the defects the patterns tend to develop. These defects are classified into two groups; unwanted pattern portions left unremoved, which are called black-spot defects, and portions needed but unintentionally etched away, called clear or white-spot defects. Of these defects, those of the white-spot type are repaired by the use of an organic compound and irradiation with an ion beam. This has been carried out in varied ways which have been proposed up to now and which are broadly of two types.

One typical process consists of applying an organic film, such as a photoresist, to the mask, and then irradiating each mask portion which has a white-spot defect with a focused ion beam to thereby polymerize or carbonize the irradiated portions of the organic film. The film portion polymerized or carbonized in this manner possesses excellent light-blocking and adhesion strength properties which render it suitable as a material for correcting white-spot defects. The process has drawbacks, however, including the need for the time-consuming step of applying the organic film and the necessity of using equipment large enough to handle the high energy, well in excess of 100 KeV, of the focused ion beam required for the irradiation.

The other process, developed by the present applicants and described in published Japanese Patent Application No. 58-201764 (Laid-Open No. 60-94728), involves directing a vapor stream of an organic compound at the surface of each white-spot defect and concurrently irradiating the surface with a focused ion beam, whereby the organic compound molecules are polymerized or carbonized to form a solid deposit on the defective portion. The second process has advantages over the first one described in that it eliminates the separate step of applying an organic film, and the equipment is simplified because of a lower energy requirement, i.e., below 30 keV, for the acceleration of the ions needed for irradiation. The kinds of organic compounds thus far proposed for use in known processes of the second type have included vacuum pump oils, organometallic compounds such as trimethylaluminum, and dibenzene complexes such as $[Cr(C_6H_6)_2]$.

When vacuum pump oil is used in remedying white-spot defects, its low vapor pressure at ordinary temperature, i.e., below $10^{-6}$ Torr, makes the supply of the oil molecules insufficient for film formation by polymerization or carbonization; consequently, the rate of film buildup to a desired thickness is low. If the vacuum pump oil is heated to raise its vapor pressure for a faster increase in film thickness, it condenses on the substrate surface. The condensate then produces incompletely polymerized or carbonized portions along the edges between the ion-beam-irradiated and non-irradiated areas, causing difficulty in film formation and other undesired effects.

The pattern-film forming processes using organometallic compounds and dibenzene complexes also have drawbacks. When the vapor pressure in the vicinity of the substrate is low, the buildup of the film layer progresses slowly, and attempts to raise the pressure in order to attain an adequately rapid film buildup will lead to difficulties such as scattering of the ion beam causing it to go out of focus, an added load upon the vapor discharge system, and adverse effects upon the ion source. Furthermore, the organic compounds containing metal atoms which are typically used are often so toxic or unstable that they pose handling problems.

SUMMARY OF THE INVENTION

An object of the present invention is to overcome the difficulties of the above-described processes and to provide a means for rapidly forming a pattern film of less than one micron thickness by the use of a film-forming depositable material with good stability and extremely low toxicity.

In accordance with the present invention, an organic compound having a vapor pressure in the range of $1 \times 10^{-4}$ to $5 \times 10^{-3}$ Torr at ordinary temperature, i.e., room temperature, is preferably used as the film-forming depositable material.

DETAILED DESCRIPTION OF PREFERRED EMBODIMENTS

Figure 1:
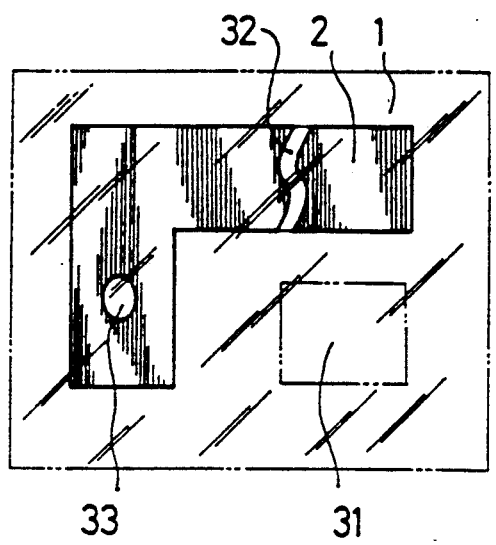
FIG. 1 is a plan view of part of a photomask having white-spot defects.

Referring to FIG. 1, a support plate or substrate 1 of glass or the like has a pattern film 2 drawn thereon with chromium or other material. Typical kinds of white-spot defects are represented by an area 31 where the pattern has been omitted, an interrupted area 32 and a pinhole area 33. In this example, the area 31 is non-contiguous with the original pattern film 2 and the areas 32 and 33 are contiguous with the original pattern film 2. These white-spot defects, which lead to undesired light transmission through the mask, must be corrected, i.e., the light-transmitting areas need to be treated so that they become as opaque to light as the rest of the pattern film 2.

Figure 2A:
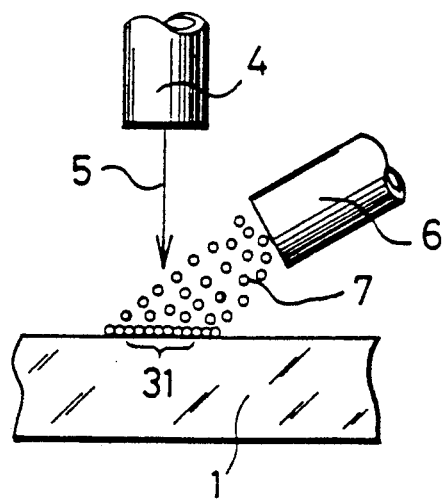
FIGS. 2a and 2b are fragmentary cross-sectional views of part of FIG. 1 illustrating the correction of white-spot defects in a photomask in accordance with the invention.
Figure 2B:
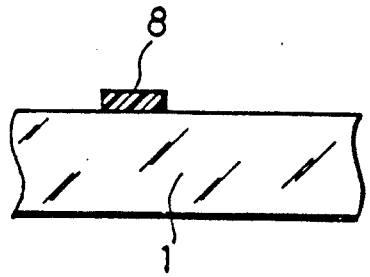

In FIG. 2a, the area of omission 31 is corrected in the manner now to be explained. The numeral 4 designates an ion-beam generator which comprises an ion source, such as a liquid metal ion source, and an ionic optical system for heating, polarizing, and focusing the ions generated by the source. An ion beam 5 produced by the source is used in scanning the area of omission 31 to effect ion irradiation at a constant rate. The numeral 6 designates a source which supplies a film-forming depositable material in the form of an organic compound. The source 6 includes a heater that controls the temperature of the source and thereby controls the quantity of vapor 7 of the organic compound to be delivered to the area 31. In this case, the support plate or substrate 1 is at room temperature. The vapor stream 7 of the organic compound, the nature of which will be described later, is deposited predominantly on the support plate 1. It is polymerized or carbonized by irradiation by means of the focused ion beam 5. FIG. 2b shows a localized deposited pattern film 8 formed in this way in the area of omission 31.

Figure 3A:
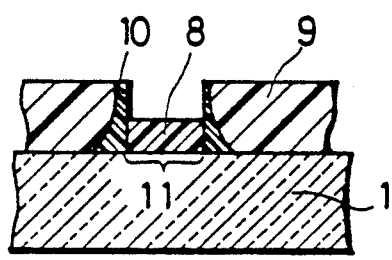
FIGS. 3a, 3b and 3c are cross-sectional views illustrating pattern film formation by using an organic compound according to the invention (FIG. 3b) and using organic compounds having vapor pressures at ordinary temperature of at most $1 \times 10^{-4}$ (FIG. 3a) or at least $5 \times 10^{-3}$ Torr (FIG. 3c).
Figure 3B:
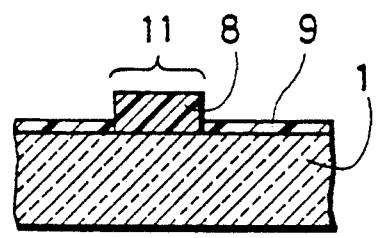

FIG. 3a illustrates a pattern film treated by the use of an organic compound having a vapor pressure of $1 \times 10^{-4}$ Torr or below at ordinary room temperature. In FIG. 3b is shown a pattern film treated with an organic compound having a room temperature vapor pressure in the range of $1 \times 10^{-4}$ to $5 \times 10^{-3}$ Torr. The conditions employed in using the ion beam 5 for irradiation, the condition of the support plate or substrate 1 and the vapor pressure of the organic compound used in the treatment shown in FIG. 3a are the same as those used in the treatment shown in FIG. 3b. In the case illustrated in FIG. 3a, the organic compound deposited on the support plate or substrate 1 forms an organic compound layer 9 because of its low evaporation rate. The portion of this organic compound layer 9 which is irradiated with the focused ion beam in the area 11 is reduced in thickness to a denser solid mass, which is lower in height than the original layer 9, and is polymerized or carbonized to form the localized pattern film 8. At the same time, areas 10 of incompletely polymerized or carbonized organic compound develop along the edges between the layer 9 of the organic compound and the pattern film 8. These portions make microfine processing difficult or can become detached when the bond strength is insufficient, producing unwanted shadows or causing other problems in the subsequent stage of selective exposure of the pattern on a semiconductor wafer.

In the example shown in FIG. 3b, the vapor 7 of an organic compound used in accordance with the invention and having a room-temperature vapor pressure in the range of $1 \times 10^{-4}$ to $5 \times 10^{-3}$ Torr was directed against the surface. The organic compound used according to the present invention, delivered in vapor form onto a localized area of the support plate or substrate 1, deposits on the surface, remains there for some time, and then evaporates. Thus, while the irradiating focused ion beam 5 is scanning, a suitable amount of the organic compound vapor 7 is supplied, and it is polymerized or carbonized by the next scan of the beam. In this manner, the localized pattern film 8 grows to a desired thickness. Outside the ion beam scanning area 11 at which the organic compound is also directed, vapor of the organic compound forms only a negligibly thin layer 9 of the organic compound. Soon after the cutoff of the vapor supply, the layer 9 will evaporate essentially completely, leaving nothing to interfere with the formation of the pattern film.

Figure 3C:
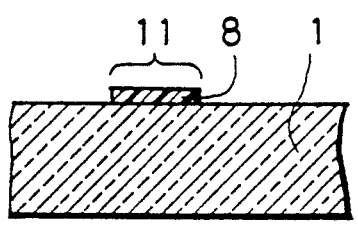

In the case of FIG. 3c, the organic compound evaporates immediately after deposition on the support plate 1. Consequently, the volume amount of the organic compound that deposits in the area 11 which is irradiated while the focused ion beam 5 is in its scanning run is too small to realize an adequate rate of film buildup to the desired thickness in the omitted area. In the one example depicted in FIG. 3c, acetylene was used and the pressure inside the organic gas nozzle was raised to 0.7 Torr. However, ion beam irradiation for as long as 20 minutes did not impart appropriate light-blocking properties to the film.

Suitable examples of depositable film-forming organic compounds suitable for use in accordance with the invention include tri- or tetracyclic aromatic compounds such as phenanthrene, pyrene, methylphenanthrene, fluoranthene, anthrone and triphenylmethane. These organic compounds have vapor pressures at ordinary temperature in the range of $1 \times 10^{-4}$ to $5 \times 10^{-3}$ Torr. Moreover, they are free from metal, they are stable, and they are only slightly toxic. Organic compounds other than the tri- and tetracyclic aromatic compounds and having molecular weights of 200 to 400 are also useful since their vapor pressures at ordinary temperature are between $1 \times 10^{-4}$ and $5 \times 10^{-3}$ Torr.

Figure 4A:
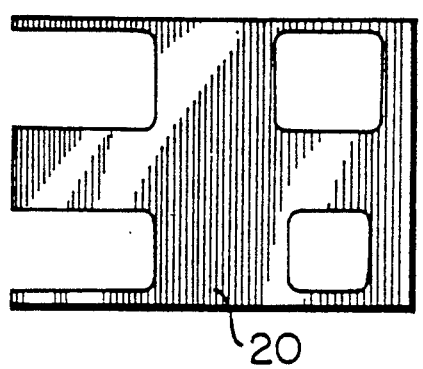
FIGS. 4a and 4b are explanatory views of two pattern films which illustrate the process of the invention.
Figure 4B:
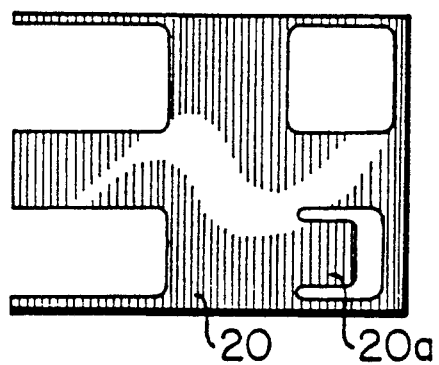

An example of a pattern film formed from pyrene, selected from among the kinds of organic compounds suitable for use in accordance with the present invention, will be described with reference to the illustrations in FIGS. 4a and 4b. FIG. 4a shows an image obtained by light transmission through a sample based on a support plate of clear glass and having a pattern 20 made of a layer of chromium of about 800 Å-thick drawn thereon yet to be formed with a pattern film in accordance with the invention. In FIG. 4b there is shown a localized pattern film area 20a which is formed according to the process of the invention, measuring 6.7 $\mu$m by 6.7 $\mu$m, on an exposed glass portion of the patterned plate shown in FIG. 4a which is 8 $\mu$m square in size. The focused ion beam used for irradiation was formed from Ga$^+$ ions, the acceleration voltage was 20 kV, and the probe current 0.13 nA. The organic compound used was pyrene which was heated to 80° C. The pattern film 20a thus formed was 1400 Å thick and provided an adequate shield or block against light transmission, providing the pattern film with sharply defined edges. The rate of thickness buildup of the pattern film was 69 Å/sec when 200 $\mu$m-long line scanning with the Ga$^+$ ion beam was carried out at the acceleration voltage of 20 kV and with the probe current of 0.13 nA. The pattern film widths were of the order of submicrons. Thus according to the present invention, the original pattern 20 is selectively altered by the addition of the localized pattern film deposit 20a.

The physical and chemical adhesion strengths of the deposited pattern film produced in this way are about the same as those of chromium film, the adhesion of which is well provides an optical density of 2.8 was approximately 2000 Å for visible light and below 1000 Å for ultraviolet rays. Under the afore-described film-forming conditions, therefore, it is possible to form a 200 $\mu$m-long, submicron-wide pattern film within 20 seconds by exposure with ultraviolet rays. The process of the invention for forming a pattern film in the foregoing way is particularly suited for producing microfine pattern films. It is also possible, of course, to form a pattern film of larger area at a faster rate by irradiation with a focused ion beam of a larger diameter with a higher probe current.

As has been described in detail above, the present invention permits pattern film formation and localized alteration of pattern films in a single processing operation that takes only a short period of time and makes possible microfine patterns of less than one micron in width. This makes possible a substantial reduction in the number of process steps or stages otherwise required. Further advantages are the ease with which the organic compound is handled and the possibility of using an apparatus of simplified construction.

We claim:

1. A process for altering the pattern of a pattern film formed on a substrate, comprising the steps of: providing a pattern-filmed substrate having a pattern film formed thereon; irradiating a predetermined area of the pattern-filmed substrate with a focused ion beam; and directing a vapor stream of film-forming depositable material onto a localized area of the pattern-filmed substrate which is being irradiated with the focused ion beam to deposit the film-forming material as a film on the predetermined area of the substrate thereby altering the pattern of the pattern film formed on the substrate.

2. A process according to claim 1; wherein the irradiating step comprises scanning the focused ion beam over the predetermined area of the pattern-filmed substrate while the vapor stream of film-forming depositable material is being continuously directed thereonto so as to control the thickness of the deposited film.

3. A processing according to claim 1; wherein the directing step comprises directing a vapor stream of film-forming depositable material comprised of organic compound vapor.

4. A process according to claim 3; wherein the vapor stream of organic compound vapor has a saturated vapor pressure at 300° K. in the range of $1 \times 10^{-4}$ to $5 \times 10^{-3}$ Torr.

5. A process according to claim 3; wherein the organic compound has a molecular weight between 200 and 400.

6. A process according to claim 1; wherein the irradiating step comprises irradiating a predetermined area of the pattern-filmed substrate with a focused ion beam comprised of a focused $Ga^+$ ion beam.

7. A process according to claim 1; wherein the providing step comprises providing a pattern-filmed substrate comprised of a mask having a white-spot film defect; the irradiating step comprises irradiating the mask at a predetermined area thereof at which the white-spot defect appears with a focused ion beam; and the directing step comprises directing a vapor stream of film-forming depositable material onto the mask in the localized area of the white-spot defect which is being irradiated with the focused ion beam to deposit the film-forming material as a film in the localized area of the white-spot defect to thereby repair the white-spot defect.

8. A mask having a repaired white-spot defect repaired according to the process of claim 7.

9. A process according to claim 7; wherein the directing step comprises directing a vapor stream of film-forming depositable material comprised of organic compound vapor.

10. A process according to claim 9; wherein the vapor stream of organic compound vapor has a saturated vapor pressure at 300° K. in the range of $1 \times 10^{-4}$ to $5 \times 10^{-3}$ Torr.

11. A process according to claim 9; wherein the organic compound vapor has a molecular weight between 200 and 400.

12. A process according to claim 7; wherein the irradiating step comprises scanning the focused ion beam over the predetermined area of the mask while the vapor stream of film-forming depositable material is being continuously directed thereonto so as to control the thickness of the deposited film.

13. A process according to claim 7; wherein the deposited film has a width of submicron size.

14. A process according to claim 7; wherein the irradiating step comprises irradiating a predetermined area of the pattern-filmed substrate with a focused ion beam comprised of a focused $Ga^+$ ion beam.

15. A process according to claim 1; wherein the irradiating and directing steps are carried out to form a deposited film of submicron size.

16. A process according to claim 1; wherein the irradiating step comprises irradiating a predetermined area of the pattern-filmed substrate which is non-contiguous with the original pattern film with a focused ion beam; and the directing step comprises directing a vapor stream of film-forming depositable material onto a localized area of the pattern-filmed substrate which is being irradiated with the focused ion beam to deposit the film-forming material as a film on the predetermined area of the substrate to thereby form a localized deposited film which is non-contiguous with the original pattern film.

17. A process according to claim 1; wherein the irradiating step comprises irradiating a predetermined area of the pattern-filmed substrate which is contiguous with the original pattern film with a focused ion beam; and the directing step comprises directing a vapor stream of film-forming depositable material onto a localized area of the pattern-filmed substrate which is being irradiated with the focused ion beam to deposit the film-forming material as a film on the predetermined area of the substrate to thereby form a localized deposited film which is contiguous with the original pattern film.

18. A substrate having an altered pattern film altered according to the process of claim 1.

19. A process according to claim 7; wherein the providing step comprises providing a photomask having a white-spot film defect.

20. A process according to claim 7; wherein the irradiating step comprises irradiating the mask with a focused ion beam comprised of a focused beam of positive ions.

21. A process according to claim 20; wherein the focused beam of positive ions comprises a focused beam of positive metallic ions.

22. A process according to claim 1; wherein the irradiating step comprises irradiating the pattern-filmed substrate with a focused ion beam comprised of a focused beam of positive ions.

23. A process according to claim 22; wherein the focused beam of positive ions comprises a focused beam of positive metallic ions.

* * * * *